(12) United States Patent
Shih et al.

(10) Patent No.: US 11,844,184 B2
(45) Date of Patent: Dec. 12, 2023

(54) INFORMATION PROCESSING SYSTEM

(71) Applicant: Fulian Precision Electronics (Tianjin) Co., LTD., Tianjin (CN)

(72) Inventors: Tung-Ho Shih, New Taipei (TW); Hung-Wei Chen, New Taipei (TW); Kuan-Chin Yu, New Taipei (TW); Ming-Heng Lu, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/864,558

(22) Filed: Jul. 14, 2022

(65) Prior Publication Data
US 2023/0309251 A1    Sep. 28, 2023

(30) Foreign Application Priority Data
Mar. 28, 2022    (CN) .......................... 202210316429.6

(51) Int. Cl.
*H05K 7/14*    (2006.01)
*H05K 5/02*    (2006.01)
*H05K 7/10*    (2006.01)

(52) U.S. Cl.
CPC .......... *H05K 7/1401* (2013.01); *H05K 5/023* (2013.01); *H05K 7/1069* (2013.01)

(58) Field of Classification Search
CPC ..... H05K 7/1401; H05K 5/023; H05K 7/1069
USPC ................ 361/759, 796, 800, 807, 809, 810
See application file for complete search history.

(56) References Cited

U.S. PATENT DOCUMENTS

| | | | | |
|---|---|---|---|---|
| 5,383,793 A | * | 1/1995 | Hsu ...................... | H05K 7/1405 361/801 |
| 8,206,677 B2 | * | 6/2012 | Sellier ...................... | G21F 9/28 376/416 |
| 8,422,242 B2 | * | 4/2013 | Lin ........................ | H05K 7/142 361/759 |
| 8,531,847 B2 | * | 9/2013 | Chang ................ | H01R 12/7029 361/755 |
| 2016/0270249 A1 | * | 9/2016 | Kidd .................... | H01R 12/721 |

FOREIGN PATENT DOCUMENTS

TW    M542798 U    6/2017

\* cited by examiner

*Primary Examiner* — Anthony Q Edwards
*Assistant Examiner* — Hung Q Dang
(74) *Attorney, Agent, or Firm* — ScienBiziP, P.C.

(57) ABSTRACT

An information processing system includes a housing, a circuit board in the housing, a functional module in the housing, and a module fixing device in the housing. The functional module is inserted into the circuit board. The module fixing device is connected to the functional module and is connected to the circuit board. The module fixing device comprises a clamping member and an elastic member. The clamping member is movably connected to the circuit board in a first direction and a second direction opposite to the first direction, the clamping member comprises a first clamping portion to clamp the functional module. The elastic member is connected to the clamping member, the elastic member is deformable in the first direction to drive the clamping member to move in the first direction to clamp the functional module.

8 Claims, 7 Drawing Sheets

INFORMATION PROCESSING SYSTEM

FIELD

The subject matter herein generally relates to an information processing system having a module fixing device.

BACKGROUND

At present, after inserting the PCIE card into the card slot, in order to prevent the PCIE card from loosening, the PCIE card is usually fixed by screws. However, due to the limited space in the chassis, it is very inconvenient to operate.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
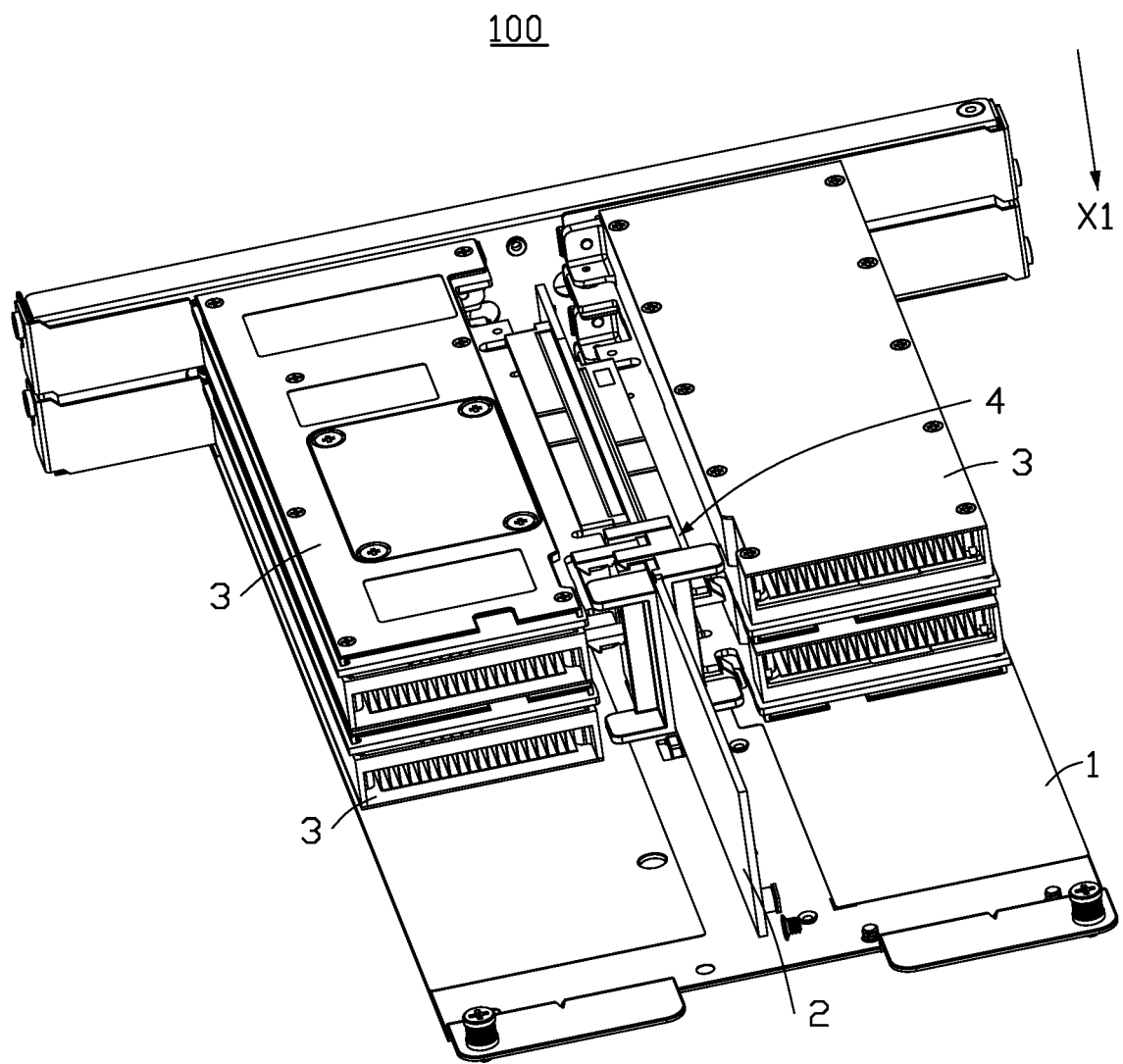
FIG. 1 is a diagrammatic view of an embodiment of a part of an information processing system according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
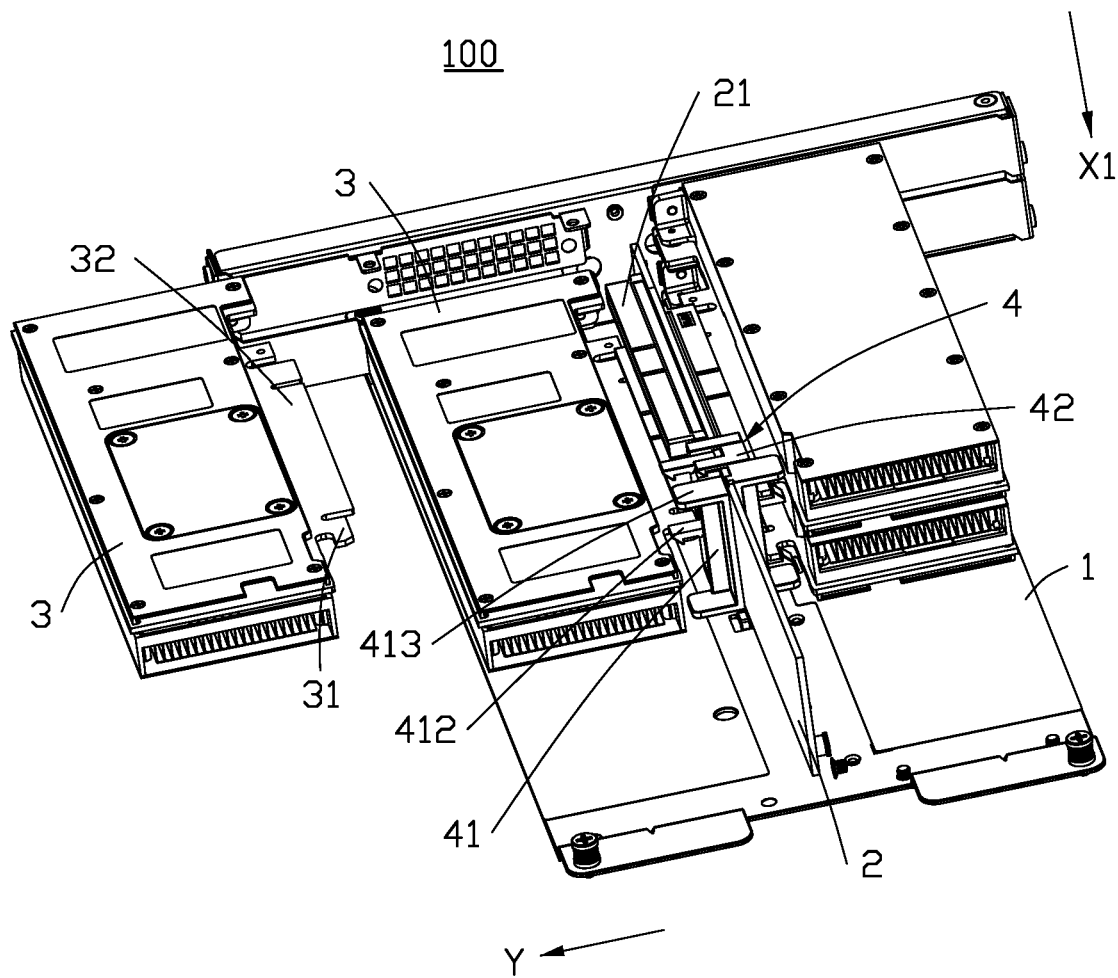
FIG. 2 is an exploded, diagrammatic view of a part of an information processing system according to the present disclosure.

FIG. 1 illustrates an embodiment of an information processing system 100. Referring to FIGS. 1 and 2, the information processing system 100 includes a housing 1, a circuit board 2 in the housing 1, a functional module 3 in the housing 1, and a module fixing device 4 in the housing 1. The circuit board 2 is connected to the housing 1. The module fixing device 4 is connected to the circuit board 2. The functional module 3 is detachably plugged into the circuit board 2.

In at least one embodiment, the information processing system 100 may be, but not limited to, a computer, a server, a workstation, or a datacenter.

The module fixing device 4 is connected to the functional module 3 to limit a displacement of the functional module 3 relative to the functional module 3. By releasing the connection between the module fixing device 4 and the functional module 3, the functional module 3 can be pulled out from the circuit board 2.

In at least one embodiment, the functional module 3 may include, but not limited to, a PCIE card, a PCI card, a graphics card, an expansion card, or a memory stick.

In at least one embodiment, t information processing system 100 may include a plurality of functional modules 3. Along a thickness direction of the circuit board 2, some functional modules 3 are arranged on one side of the circuit board 2, and another part of functional modules 3 are arranged on the other side of the circuit board 2. A plurality of functional modules 3 located on the same side of the circuit board 2 are stacked along a first direction X1, which may improve the space utilization of the information processing system 100.

Figure 3:
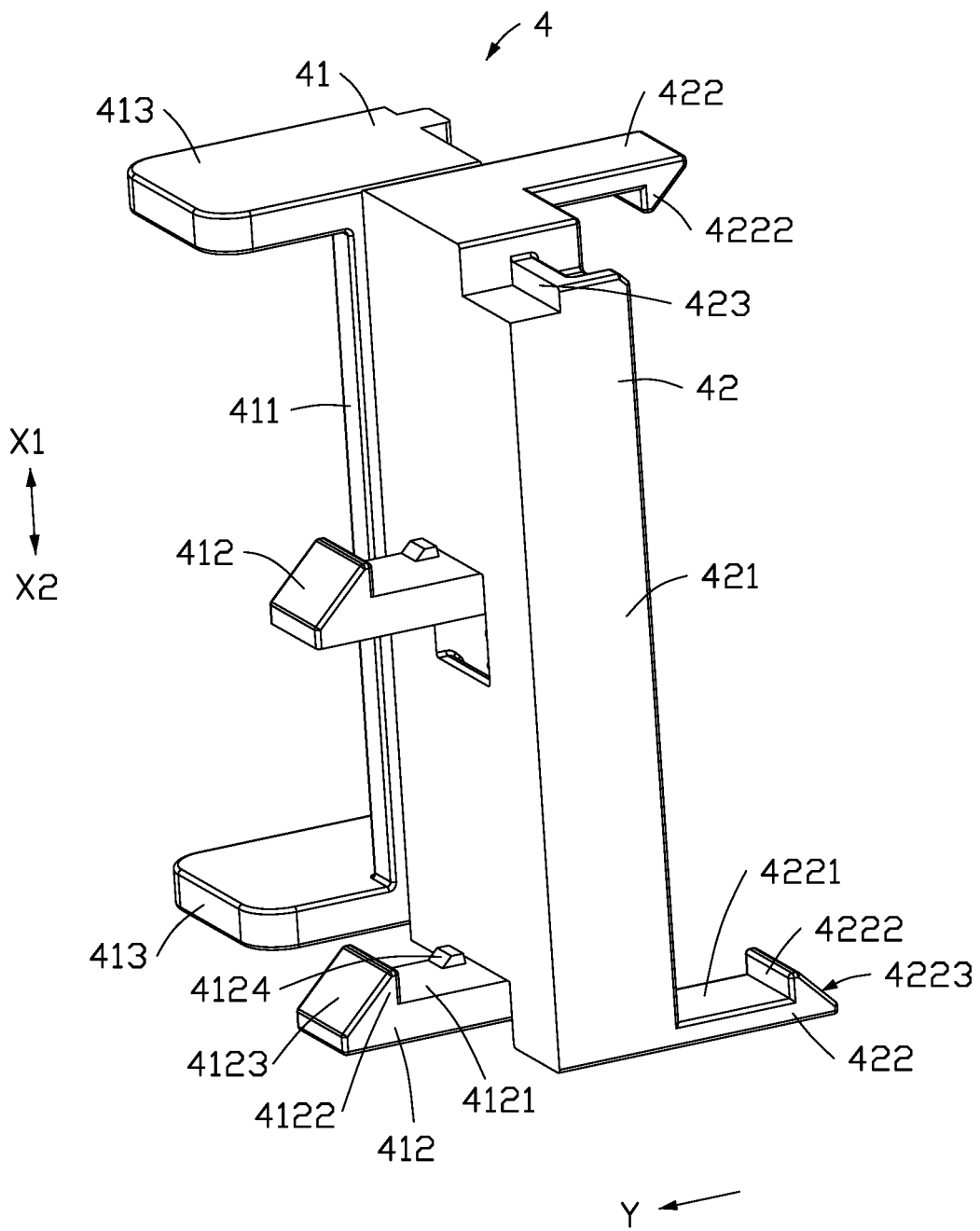
FIG. 3 is a diagrammatic view of an embodiment of a module fixing device according to the present disclosure.
Figure 4:
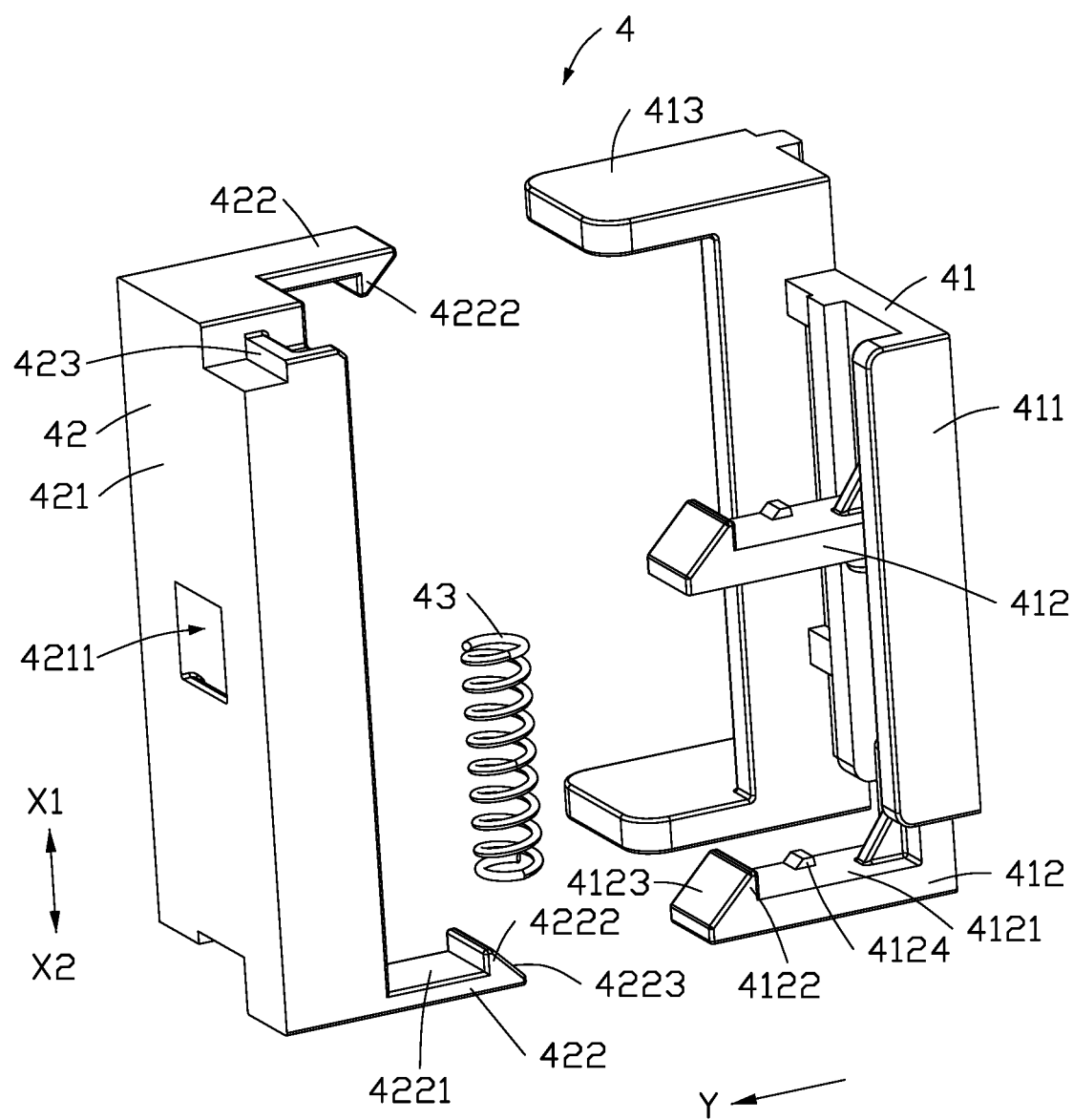
FIG. 4 is an exploded, diagrammatic view of a module fixing device according to the present disclosure.

Referring to FIGS. 2, 3, and 4, the module fixing device 4 includes a clamping member 41, an elastic member 43, and a connecting member 42. The connecting member 42 is connected to the circuit board 2. The clamping member 41 is movably connected to the connecting member 42 in the first direction X1 and a second direction X2 opposite to the first direction X1. The clamping member 41 moves along the first direction X1 to be able to clamp the functional modules 3 plugged into the circuit board 2 to fix the functional modules 3. The lamping member 41 moves along the second direction X2 to be able to release the clamping state of the functional modules 3, so that the functional modules 3 can be pulled out from the circuit board 2. The elastic member 43 connects the clamping member 41 and the connecting member 42. The elastic member 43 has a restoring force along the first direction X1, and the restoring force can drive the clamping member 41 to move along the first direction X1 to clamp and fix the functional modules 3 plugged into the circuit board 2.

In at least one embodiment, the connecting member 42 may be omitted. The clamping member 41 is directly connected to the circuit board 2 or the housing 1. The elastic member 43 connects the clamping member 41 and the circuit board 2, or connects the clamping member 41 and the housing 1. The restoring force of the elastic member 43 can drive the clamping member 41 to move relative to the circuit board 2 along the first direction X1, so that the clamping member 41 can clamp and fix the functional modules 3 plugged into the circuit board 2.

In at least one embodiment, the elastic member 43 may be a compression spring. A front end portion of the compression spring along the first direction X1 abuts against the clamping member 41, and a rear end portion of the compression spring along the first direction X1 abuts against the connecting member 42. In at least one embodiment, the elastic member 43 may be a tension spring. A front end portion of the tension spring along the first direction X1 is connected to the clamping member 41, and a rear end portion of the tension spring along the first direction X1 is connected to the connecting member 42.

In at least one embodiment, the clamping member 41 includes a first substrate 411 and a first clamping portion 412. The first substrate 411 is connected to the connecting member 42, the first clamping portion 412 extends from the first substrate 411 along a third direction Y. The first substrate 411 drives the first clamping portion 412 to move relative to the connecting member 42 along the first direction X1 and the second direction X2. In at least one embodiment, the third direction Y and the first direction X1 are arranged at an angle. In at least one embodiment, the third direction Y and the first direction X1 are arranged at an angle of 90°.

In at least one embodiment, the first clamping portion 412 includes a first surface 4121, a first protruding portion 4122, and a first guiding surface 4123. The first surface 4121 faces to the first direction X1. The first protruding portion 4122 protrudes from the first surface 4121 along the first direction X1. The first guiding surface 4123 is provided on an end portion of the first clamping portion 412 away from the first substrate 411 and is connected to the first protruding portion 4122.

A first stopper 31 and an inserting portion 32 are arranged on each functional module 3 and are located on a same side of the functional module 3. The circuit board 2 is provided with a socket 21. The socket 21 corresponds to the inserting portion 32, and can be used to butt the socket 21, so that the functional module 3 can be electrically connected to the circuit board 2. When the clamping member 41 and the functional module 3 approach each other along the third direction Y, the first guiding surface 4123 abuts against the first stopper 31 to guide the functional module 3 and the first clamping portion 412 to approach each other until the first protruding portion 4122 and the first stopper 31 are engaged with each other. At this time, the inserting portion 32 is inserted into the socket 21, the clamping member 41 is engaged with the first stopper 31 through the first protruding portion 4122 to clamp and fix the functional module 3, which can limit a displacement of the functional module 3 away from the circuit board along the third direction Y. In addition, no additional fasteners and operating space are required, the space utilization rate of the information processing system 100 can be improved, and it is suitable for application scenarios with narrow space.

In at least one embodiment, the clamping member 41 includes a plurality of first clamping portions 412. The plurality of first clamping portions 412 are arranged at intervals along the first direction X1, so that the clamping member 41 may clamp a plurality of functional modules 3 to improve the space utilization rate of the information processing system 100. For example, the clamping member 41 includes two first clamping portions 412.

In at least one embodiment, the clamping member 41 may further include a handle portion 413. The handle portion 413 is arranged on the first substrate 411. By applying a force along the second direction X2 on the handle portion 413, the handle portion 413 may drive the first substrate 411 and the first clamping portion 412 to move along the second direction X2, so that the first protruding portion 4122 is separated from the first stopper 31, and the clamping member 41 is released from the functional module 3. At this time, the functional module 3 can be pulled out from the circuit board 2. In at least one embodiment, the handle portion 413 extends along the third direction Y from the first substrate 411. In at least one embodiment, when it is necessary to release the clamping state of the functional module 3, the handle portion 413 can be pulled up. The operation is simple and convenient, and the operation space in the third direction Y is not required, which can improve the space utilization rate of the information processing system 100, and it is suitable for application scenarios with narrow space.

In at least one embodiment, the connecting member 42 includes a second substrate 421 and a second clamping portion 422. The second clamping portion 422 is arranged on the second substrate 421. The first substrate 411 is connected to the second substrate 421. The first substrate 411 and the second substrate 421 can move to each other along the first direction X1 and the second direction X2. The second clamping portion 422 is connected to the circuit board 42, so that the connecting member 42 is connected to the circuit board 2.

In at least one embodiment, the connecting member 42 may include two second clamping portions 422. The second clamping portions 422 are disposed on opposite sides of the second substrate 421 along the first direction X1, and abuts against opposite ends of the circuit board 2 along the first direction X1.

In at least one embodiment, the second substrate 421 defines a through hole 4211. The first clamping portion 412 penetrates through the through hole 4211. Along the third direction Y, the first substrate 411 is located on a side of the second substrate 421, the first protruding portion 4122 and the first guiding surface 4123 are located on the other side of the second substrate 421. The number of the through holes 4211 on the second substrate 421 corresponds to the number of the first clamping portion 412 of the clamping member 41.

In at least one embodiment, the first clamping portion may further include a third protruding portion 4124. The third protruding portion 4124 protrudes from the first surface 4121 along first direction X1 and is located between the first protruding portion 4122 and the first substrate 411. When the first clamping portion 412 penetrates through the through hole 4211, the third protruding portion 4124 and the first protruding portion 4122 are located on a same side of the second substrate 421, and the third protruding portion 4124 abuts against the second substrate 421, so that the clamping member 41 is stably connected to the connecting member 42. In at least one embodiment, the third protruding portion 4124 includes an inclined surface facing the first protruding portion 4122, so that when the third protruding portion 4124 moves toward the second substrate 421, the inclined surface guides the third protruding portion 4124 to move to a side of the second substrate 421 facing away from the second clamping portion 422.

Figure 5:
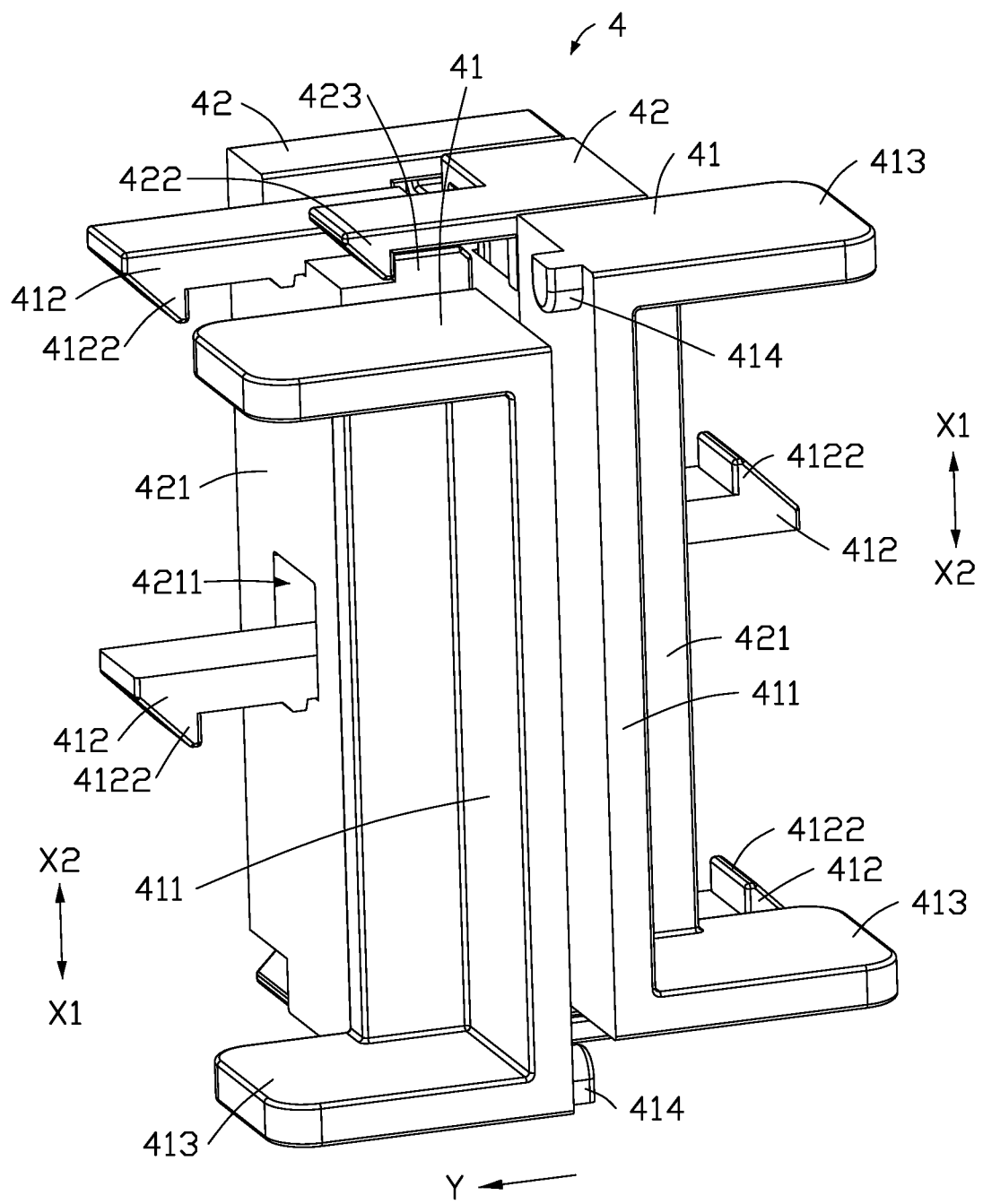
FIG. 5 is a diagrammatic view of an embodiment of a module fixing device according to the present disclosure.
Figure 6:
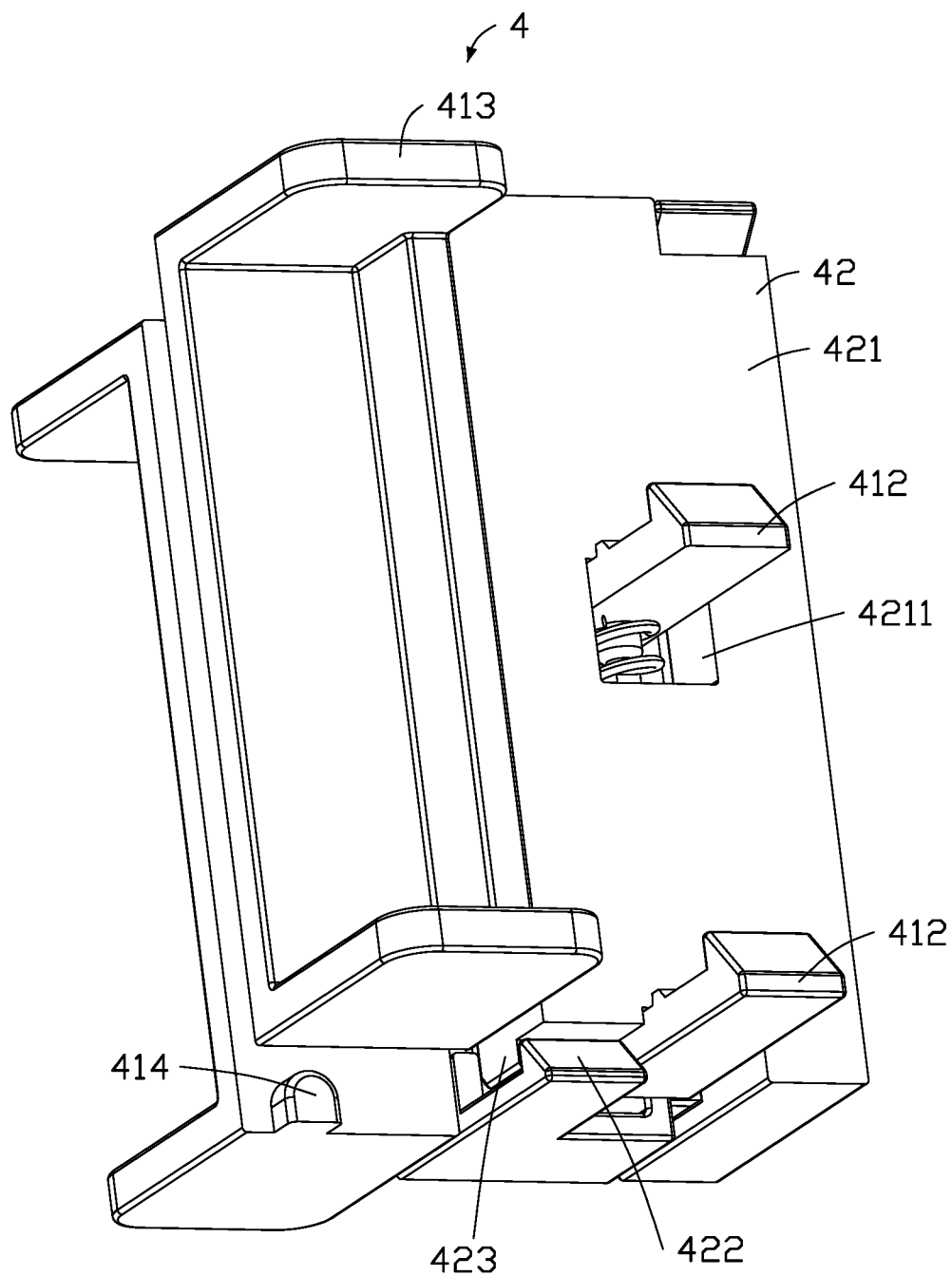
FIG. 6 is a diagrammatic view of an embodiment of the module fixing device of FIG. 5 viewed from another angle.
Figure 7:
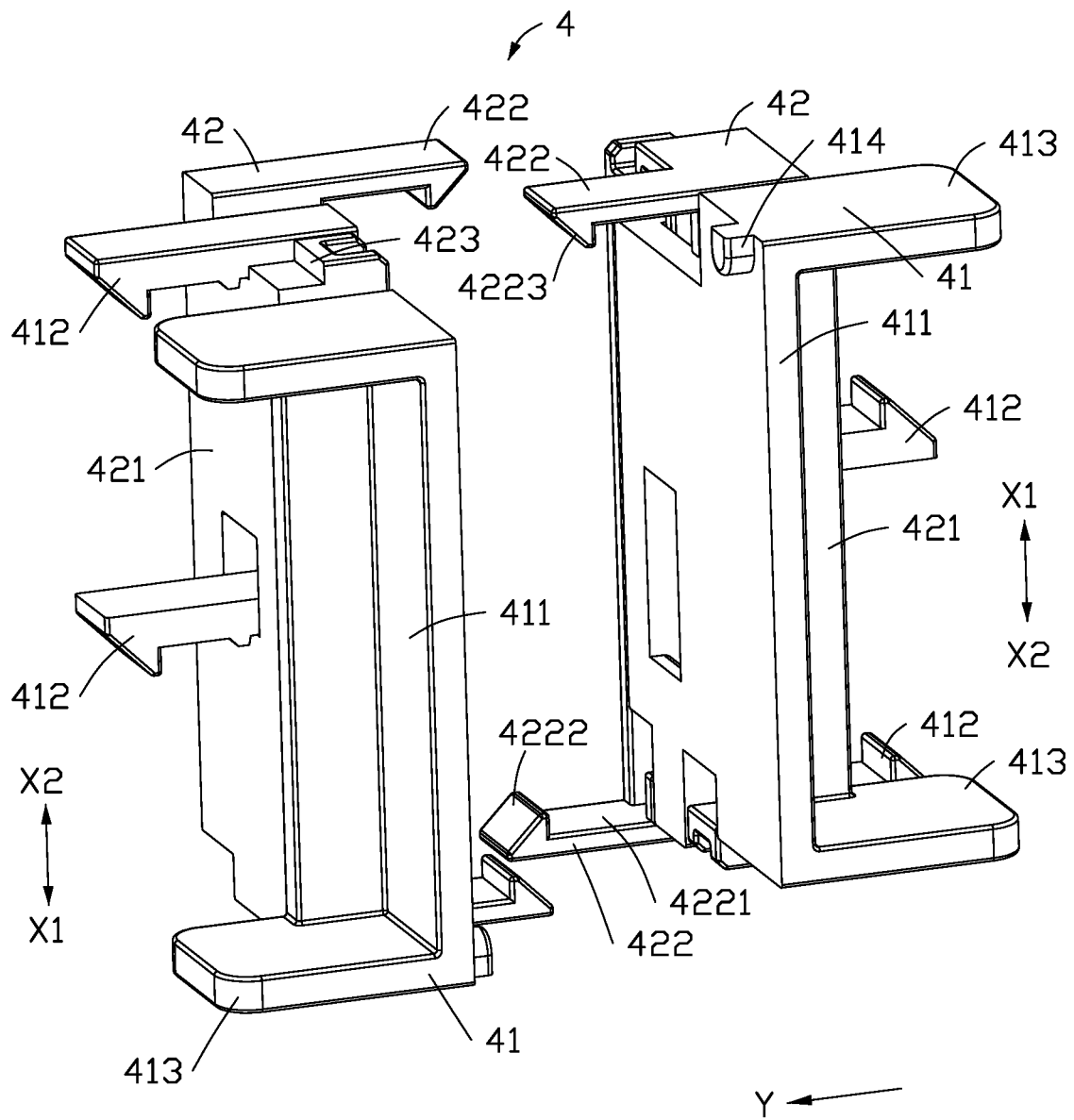
FIG. 7 is an exploded, diagrammatic view of a module fixing device according to the present disclosure.

Referring to FIGS. 5, 6, and 7, in at least one embodiment, the connecting member 42 further includes a second stopper 423. The second stopper 423 is arranged on the second substrate 421. The module fixing device 4 includes two clamping members 41 and two connecting members 42. The first substrate 411 of one of the clamping members 41 is located between the second substrate 421 of one of the connecting members 42 and the circuit board 2. The first substrate 411 of another clamping member 41 is located between the second substrate 421 of another connecting member 42 and the circuit board 2. The second clamping portion 422 of one of the connecting members 42 is connected to the second stopper 423 of another connecting member 42, so that the clamping members 41 are fixed on the circuit board 2 by the connecting members 42.

In at least one embodiment, orientations of the first clamping portions 412 of the clamping members 41 are opposite.

In at least one embodiment, the connecting member 42 includes two second clamping portions 422 and two second stoppers 423. The second clamping portions 422 are respectively arranged opposite ends of the second substrate 421 along the first direction X1. The second stoppers 423 are respectively arranged the opposite ends of the second substrate 421 along the first direction X1. The second clamping portion 422 and the second stopper 423 located on a same side of the second substrate 421 are spaced from each other along a direction perpendicular to the first direction X1 and the second direction Y.

In at least one embodiment, the second clamping portion 422 includes a second surface 4221, a second protruding portion 4222, and a second guiding surface 4223. The second surface 4221 faces an inner side of the connecting member 42. The second protruding portion 4222 protrudes from the second surface 4221. The second guiding surface 4223 is provided on an end portion of the second clamping portion 422 away from the second substrate 421 and is connected to the second protruding portion 4222. When two connecting members 42 approach each other along the third direction Y, the second guiding surface 4223 abuts against the second stopper 423 to guide the connecting members 42 to approach each other until the second protruding portion 4222 and the second stopper 423 are engaged with each other. At this time, the connecting members 42 are fixedly connected to each other through the second protruding portion 4222 and the second stopper 423, which can limit a displacement of the connecting members 42 along the third direction Y. In addition, no additional fasteners and operating space are required, the space utilization rate of the information processing system 100 can be improved, and it is suitable for application scenarios with narrow space.

In at least one embodiment, the clamping member 41 may further include a third stopper 414. The third stopper 414 is arranged on a side of the first substrate 411 facing away from the first clamping portion 412. Along the first direction X1, the first surface 4121 faces the third stopper 414. When the clamping member 41 is connected to the circuit board 2 by the connecting member 42, the third stopper 414 is located at an outer side of the circuit board 2 along the first direction X1. When the clamping member 41 clamps and fixes the functional module 3, a gap is formed between the third stopper 414 and the circuit board 2. When the handle portion 413 is used to move the clamping member 41 along the second direction X2, the third stopper 414 may abut against the circuit board 2 to limit a displacement of the clamping member 41 along the second direction X2, so as to avoid excessive movement of the clamping member 41.

In at least one embodiment, the installation steps of the functional module 3 are as follows: two connecting members 42 are connected, and two clamping member 41 are connected to the circuit board 2; then the functional module 3 is moved close to the circuit board 2 until the functional module 3 is inserted into the circuit board 2 and the first clamping portion 412 is engaged with the first stopper 31.

In at least one embodiment, the disassembly steps of the functional module 3 are as follows: the handle portion 413 of the clamping member 41 is pulled up to separate the first clamping portion 412 from the first stopper 31; then the functional module 3 is moved away from the circuit board 2.

In the above-mentioned information processing system, the module fixing device 4 drives the clamping member 41 to move along the first direction X1 through the elastic member 43, so that the first clamping portion 412 clamps the functional module 3, the structure of the information processing system is compact. By pulling the handle portion 413 to release the clamping state of the clamping member 41 on the functional module 3, the operation is simple and convenient, and no operating space in the third direction Y is required, which can improve the space utilization rate of the information processing system 100, and it is suitable for application scenarios with narrow space.

the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. An information processing system comprising:
a housing;
a circuit board in the housing;
a functional module in the housing; and
a module fixing device in the housing;
wherein the functional module is inserted into the circuit board, the module fixing device is connected to the functional module and is connected to the circuit board; the module fixing device comprises a clamping member and an elastic member; the clamping member is movably connected to the circuit board in a first direction and a second direction opposite to the first direction, the clamping member comprises a first clamping portion to clamp the functional module; the elastic member is connected to the clamping member, the elastic member is deformable in the first direction to drive the clamping member to move in the first direction to clamp the functional module; the module fixing device further comprises a connecting member, the connecting member connects the circuit board and the clamping member, the clamping member moves relative to the connecting member in the first direction and the second direction; an end portion of the elastic member abuts against the connecting member, and another end portion of the elastic member abuts against the clamping member, the elastic member drives the clamping member to move relative to the connecting member in the first direction.

2. The information processing system of claim 1, wherein the clamping member comprises a plurality of first clamping portions, the information processing system comprises a plurality of functional modules; the plurality of first clamping portions are arranged at intervals along the first direction to clamp the plurality of functional modules.

3. The information processing system of claim 1, wherein the first clamping portion comprises a first surface facing the first direction, a first protruding portion protruding from the first surface along the first direction, and a first guiding surface; the first guiding surface is provided on an end portion of the first clamping portion and is connected to the first protruding portion, the first guiding surface is configured for abutting against the functional module to guide the functional module and the clamping member to move towards each other.

4. The information processing system of claim 1, wherein the module fixing device further comprises two connecting members, the connecting members are connected to each other and respectively located on opposite sides of the circuit board; each of the connecting members comprises a second clamping portion and a second stopper, the second clamping portion of one of the connecting members is connected to the second stopper of the other of the connecting members.

5. The information processing system of claim 3, wherein the clamping member further comprises a first substrate and a handle portion, the first substrate is connected to the connecting member, the first clamping portion extends from the first substrate, the handle portion is arranged on the first substrate.

6. The information processing system of claim 4, wherein the clamping member comprises two first clamping portions, at least a portion of one of the first clamping portions is located between one of the connecting members and the circuit board, at least a portion of the other of the first clamping portions is located between the other of the connecting members and the circuit board.

7. The information processing system of claim 5, wherein the connecting member further comprises a second substrate, the second clamping portion and the second stopper are arranged on the second substrate; the first substrate is located between the second substrate and the circuit board.

8. The information processing system of claim 7, wherein an orientation of the first clamping portion and an orientation of the second clamping portion are opposite.

* * * * *